United States Patent
Sabri et al.

(10) Patent No.: US 10,173,193 B2
(45) Date of Patent: Jan. 8, 2019

(54) AMMONIA RADICAL GENERATOR

(71) Applicant: Lam Research Corporation, Fremont, CA (US)

(72) Inventors: Mohamed Sabri, Beaverton, OR (US); Karl Leeser, West Linn, OR (US)

(73) Assignee: Lam Research Corporation, Fremont, CA (US)

(*) Notice: Subject to any disclaimer, the term of this patent is extended or adjusted under 35 U.S.C. 154(b) by 389 days.

(21) Appl. No.: 14/973,579

(22) Filed: Dec. 17, 2015

(65) Prior Publication Data

US 2017/0050165 A1 Feb. 23, 2017

Related U.S. Application Data

(63) Continuation-in-part of application No. 14/918,510, filed on Oct. 20, 2015.

(60) Provisional application No. 62/206,773, filed on Aug. 18, 2015.

(51) Int. Cl.
 *B01J 19/12* (2006.01)

(52) U.S. Cl.
 CPC ...... *B01J 19/123* (2013.01); *B01J 2219/0801* (2013.01); *B01J 2219/0871* (2013.01); *B01J 2219/0875* (2013.01); *B01J 2219/1203* (2013.01)

(58) Field of Classification Search
 CPC .............. B01J 19/123; B01J 2219/1203; B01J 2219/0875; B01J 2219/0871; B01J 2219/0801
 See application file for complete search history.

(56) References Cited

U.S. PATENT DOCUMENTS

| | | | |
|---|---|---|---|
| 3,748,243 A | | 7/1973 | Christiaens et al. |
| 4,435,445 A | | 3/1984 | Allred et al. |
| 4,588,610 A | | 5/1986 | Yamazaki |
| 4,702,936 A | | 10/1987 | Maeda et al. |
| 4,995,955 A | | 2/1991 | Kim et al. |
| 5,372,781 A | * | 12/1994 | Hallett ............ A61L 2/10 422/186 |
| 6,461,520 B1 | | 10/2002 | Engelhard et al. |
| 7,391,041 B2 | | 6/2008 | Sajo et al. |
| 7,858,510 B1 | | 12/2010 | Banerji et al. |
| 8,405,046 B2 | | 3/2013 | NeCamp |

(Continued)

*Primary Examiner* — Nicholas A Smith
*Assistant Examiner* — Colleen M Raphael
(74) *Attorney, Agent, or Firm* — Martine Penilla Group, LLP

(57) ABSTRACT

An apparatus includes a base having first and second inlets. Inner and outer cylinders are disposed on the base, with the outer cylinder being concentric with the inner cylinder. An inner surface of the inner cylinder defines an internal volume. An outer surface of the inner cylinder and an inner surface of the outer cylinder define a chamber space. An ultraviolet lamp is disposed within the internal volume. A top cover is positioned over the inner and outer cylinders and in a sealing relationship with the cylinders. The top cover has a first passageway in flow communication with the chamber space, and a second passageway in flow communication with the internal volume. The first inlet is in flow communication with the chamber space and the second inlet is in flow communication with the internal volume. A system including a process chamber and an ammonia radical generator also is described.

20 Claims, 14 Drawing Sheets

(56) References Cited

U.S. PATENT DOCUMENTS

| | | |
|---|---|---|
| 8,834,789 B2 | 9/2014 | Schiene et al. |
| 2002/0175067 A1 | 11/2002 | Sherwood |
| 2006/0057799 A1 | 3/2006 | Horiguchi et al. |
| 2007/0246176 A1 | 10/2007 | Miyawaki et al. |
| 2008/0078987 A1 | 4/2008 | Leusink |
| 2010/0075507 A1 | 3/2010 | Chang |
| 2014/0159244 A1 | 6/2014 | Lu et al. |
| 2015/0375275 A1* | 12/2015 | Chan .................. B08B 7/0057 134/1 |

* cited by examiner

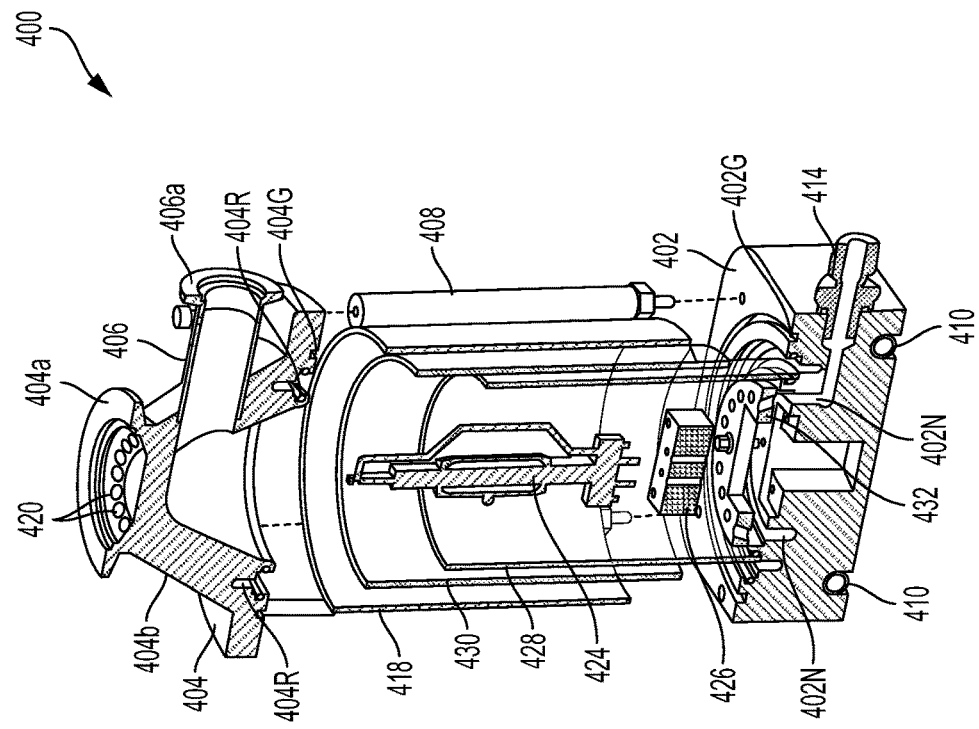
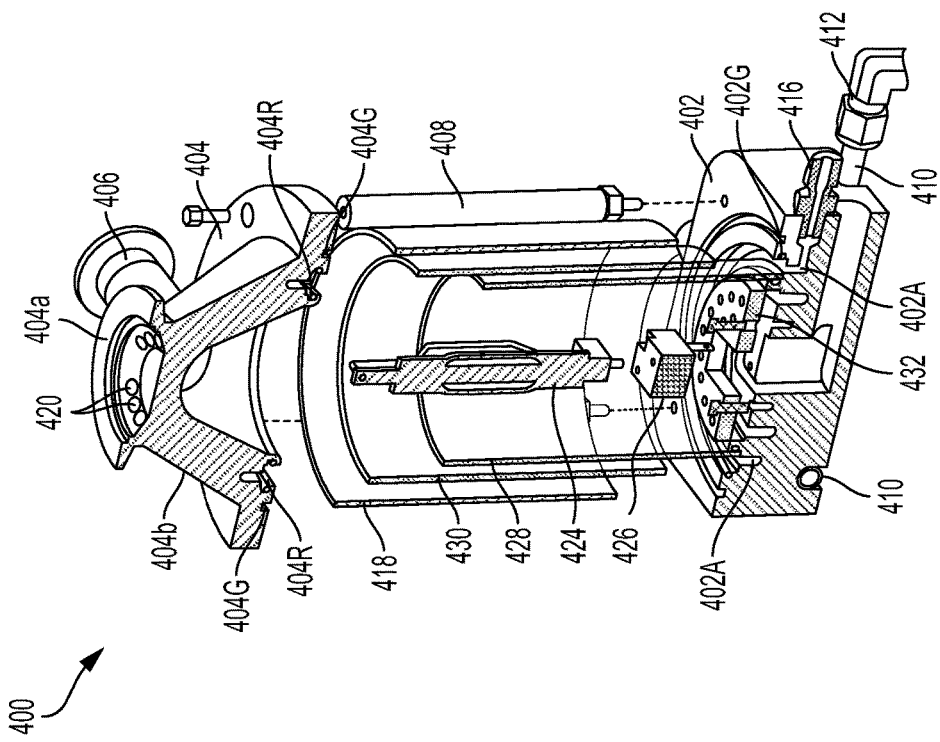

AMMONIA RADICAL GENERATOR

CROSS-REFERENCE TO RELATED APPLICATIONS

This application is a continuation-in-part of U.S. patent application Ser. No. 14/918,510, filed Oct. 20, 2015, which claims priority under 35 U.S.C. § 119(e) to U.S. Provisional Patent Application No. 62/206,773, filed Aug. 18, 2015. The disclosures of each of these applications from which priority is claimed are incorporated by reference herein in their entirety for all purposes.

BACKGROUND

In various semiconductor processes, activated ammonia radicals (NH*) are used for reaction chemistry. Certain classes of reactions require generation of ammonia radicals at low energy without creating hydrogen ions or radicals.

Many processes leverage plasma resources to generate ammonia radicals, with inductively coupled plasma (ICP) sources being the most common. ICP sources are physically large, complex, and expensive. These sources typically require dilution with a plasma feedgas that enables low pressure ionization and therefore operation, but competes with radical generation efficiency. Most importantly, however, substantial ion flux at relatively high ion energy is generated that is damaging to low-k dielectric substrates.

Further, ultraviolet (UV) sources typically consume large amounts of electrical power to do useful work. Much of this power is wasted in the parasitic production of ozone in the atmospheric air surrounding the UV source assemblies.

It is in this context that embodiments arise.

SUMMARY

In an example embodiment, an apparatus includes a base having a first inlet and a second inlet. An inner cylinder and an outer cylinder are disposed on the base, with the outer cylinder being concentric with the inner cylinder. The inner cylinder is comprised of a first quartz material, and an inner surface of the inner cylinder defines an internal volume. The outer cylinder is comprised of a second quartz material, and an outer surface of the inner cylinder and an inner surface of the outer cylinder define a chamber space. An ultraviolet (UV) lamp is disposed within the internal volume. The apparatus further includes a top cover positioned over the inner cylinder and the outer cylinder and in a sealing relationship with each of the inner cylinder and the outer cylinder. The top cover has a first passageway in flow communication with the chamber space, and the top cover has a second passageway in flow communication with the internal volume. The first passageway is not in flow communication with the second passageway. The first inlet of the base is in flow communication with the chamber space and the second inlet of the base is in flow communication with the internal volume.

In one embodiment, the first quartz material of which the inner cylinder is comprised has at least 90% transmissivity to UV-C energy having a wavelength in the range from 200 nanometers to 220 nanometers. In one embodiment, the second quartz material of which the outer cylinder is comprised reflects UV-C energy having a wavelength in the range from 200 nanometers to 220 nanometers.

In one embodiment, the top cover has an annular channel formed therein and top ends of each of the inner cylinder and the outer cylinder are located within the annular channel, a first sealing member is provided around the inner surface of the top end of the inner cylinder, and a second sealing member is provided around an outer surface of the top end of the outer cylinder.

In one embodiment, the first passageway is a hole that extends from the annular channel to a top section of the top cover. In one embodiment, the second passageway includes a plenum and a tube, with the plenum being defined by an inner surface of the top cover, and the tube being in flow communication with the plenum and extending from a side of the top cover.

In one embodiment, the apparatus further includes an outer enclosure that surrounds the outer cylinder, one end of the outer enclosure being located within a groove formed in the base and another end of the outer enclosure being located within a groove formed in the top cover.

In another example embodiment, an apparatus includes a base having a first inlet and a second inlet. The base has an outer annular channel and an inner annular channel formed therein, with the outer annular channel being in flow communication with the first inlet and the inner annular channel being in flow communication with the second inlet. The apparatus also includes a plurality of supports, each of the supports having an upper end and a lower end, with the lower end of each of the supports being disposed in the base. An inner cylinder is comprised of a first quartz material. A lower end of the inner cylinder is located within the outer annular channel, and an inner surface of the inner cylinder defines an internal volume. An outer cylinder, which is concentric with the inner cylinder, is comprised of a second quartz material. A lower end of the outer cylinder is located within the outer annular channel, and an outer surface of the inner cylinder and an inner surface of the outer cylinder define a chamber space. A first sealing member is provided around the inner surface of the lower end of the inner cylinder, and a second sealing member is provided around an outer surface of the lower end of the outer cylinder. An ultraviolet (UV) lamp is disposed within the internal volume. The apparatus further includes a top cover mounted on the plurality of supports so that the upper ends of the plurality of supports are disposed in the top cover. The top cover has an annular channel formed therein and upper ends of each of the inner cylinder and the outer cylinder are located within the annular channel. The top cover also has a sloped side portion and a top portion. The inner surface of the top cover defines a plenum that is in flow communication with the internal volume, and the sloped side portion has a tube extending therefrom, with the tube being in flow communication with the plenum. The sloped side portion also has a plurality of holes formed therein, with each of the holes extending from the annular channel to the top portion. A third sealing member is provided around the inner surface of the upper end of the inner cylinder, and a fourth sealing member is provided around an outer surface of the upper end of the outer cylinder. A first passageway is defined from the first inlet to the top section of the top cover through the base, the chamber space, the annular channel formed in the top cover, and the plurality of holes formed in the side portion of the top cover. A second passageway is defined from the second inlet to the tube extending from the side portion of the top cover through the base, the internal volume, and the plenum. The first passageway is not in flow communication with the second passageway.

In one embodiment, the first quartz material of which the inner cylinder is comprised has at least 90% transmissivity to UV-C energy having a wavelength in the range from 200 nanometers to 220 nanometers. In one embodiment, the second quartz material of which the outer cylinder is comprised reflects UV-C energy having a wavelength in the range from 200 nanometers to 220 nanometers further.

In one embodiment, the apparatus further includes an outer enclosure that surrounds the outer cylinder, with one end of the outer enclosure being located within a groove formed in the base and another end of the outer enclosure being located within a groove formed in the top cover. In one embodiment, one or more of the first, second, third, and fourth sealing members is an O-ring.

In one embodiment, the apparatus further includes a cooling tube disposed in the base. In one embodiment, the apparatus further includes a cover plate disposed on a top surface of the base, with the cover plate having a plurality of holes therein. The holes are in flow communication with the inner annular channel formed in the base and the internal volume. In one embodiment, one or more of the plurality of holes is aligned with a central portion of the UV lamp.

In yet another example embodiment, a system includes a process chamber and an ammonia radical generator coupled to the process chamber in flow communication. The ammonia radical generator includes a base having a first inlet and a second inlet. An inner cylinder and an outer cylinder are disposed on the base. The inner cylinder is comprised of a first quartz material, and an inner surface of the inner cylinder defines an internal volume. The outer cylinder, which is concentric with the inner cylinder, is comprised of a second quartz material. An outer surface of the inner cylinder and an inner surface of the outer cylinder define a chamber space. An ultraviolet (UV) lamp disposed is within the internal volume. The ammonia radical generator further includes a top cover positioned over the inner cylinder and the outer cylinder and in a sealing relationship with each of the inner cylinder and the outer cylinder. The top cover has a first passageway in flow communication with the chamber space, and the top cover has a second passageway in flow communication with the internal volume. The first passageway is not in flow communication with the second passageway. The system further includes a source of ammonia gas coupled to the first inlet in flow communication, with the first inlet being in flow communication with the chamber space through the base. A source of cooling gas is coupled to the second inlet in flow communication, with the second inlet being in flow communication with the internal volume through the base.

In one embodiment, the first quartz material of which the inner cylinder is comprised has at least 90% transmissivity to UV-C energy having a wavelength in the range from 200 nanometers to 220 nanometers, and the second quartz material of which the outer cylinder is comprised reflects UV-C energy having a wavelength in the range from 200 nanometers to 220 nanometers.

In one embodiment, the ammonia radical generator further includes an outer enclosure that surrounds the outer cylinder, with one end of the outer enclosure being located within a groove formed in the base and another end of the outer enclosure being located within a groove formed in the top cover.

In one embodiment, the top cover has an annular channel formed therein and top ends of each of the inner cylinder and the outer cylinder are located within the annular channel. A first sealing member is provided around the inner surface of the top end of the inner cylinder, and a second sealing member is provided around an outer surface of the top end of the outer cylinder.

In one embodiment, the second passageway includes a plenum and a tube. The plenum is defined by an inner surface of the top cover, and the tube is in flow communication with the plenum and extends from a side of the top cover.

Other aspects and advantages of the disclosures herein will become apparent from the following detailed description, taken in conjunction with the accompanying drawings, which illustrate by way of example the principles of the disclosures.

BRIEF DESCRIPTION OF THE DRAWINGS

FIGS. 9A and 9B illustrate exploded cross-sectional views of the ammonia radical generator shown in FIG. 7A, in accordance with an example embodiment.

DETAILED DESCRIPTION

In the following description, numerous specific details are set forth in order to provide a thorough understanding of the example embodiments. However, it will be apparent to one skilled in the art that the example embodiments may be practiced without some of these specific details. In other instances, process operations and implementation details have not been described in detail, if already well known.

In the following embodiments, an activated ammonia radical (NH*) generator is disclosed. The generator has a coaxial geometry in which a high power ultraviolet (UV) bulb, which is centrally disposed in the generator, is surrounded by a flow of ammonia gas. The method of ammonia radical generation implemented in the disclosed generator is targeted at breaking the ammonia specifically into ammonia radicals (NH*) and hydrogen ($H_2$). The disclosed generator is extremely efficient because almost all of the UV energy is absorbed by the ammonia gas rather than being absorbed by ozone generation in atmospheric air (as is the case when plasma resources are leveraged to generate ammonia radicals). This efficiency reduces system complexity and electrical power consumption and thereby reduces operating costs. Furthermore, by avoiding the generation of ozone from atmospheric oxygen, the disclosed generator eliminates the need to deal with high exhaust flows as well as other challenges typically associated with ozone abatement.

Figure 1:
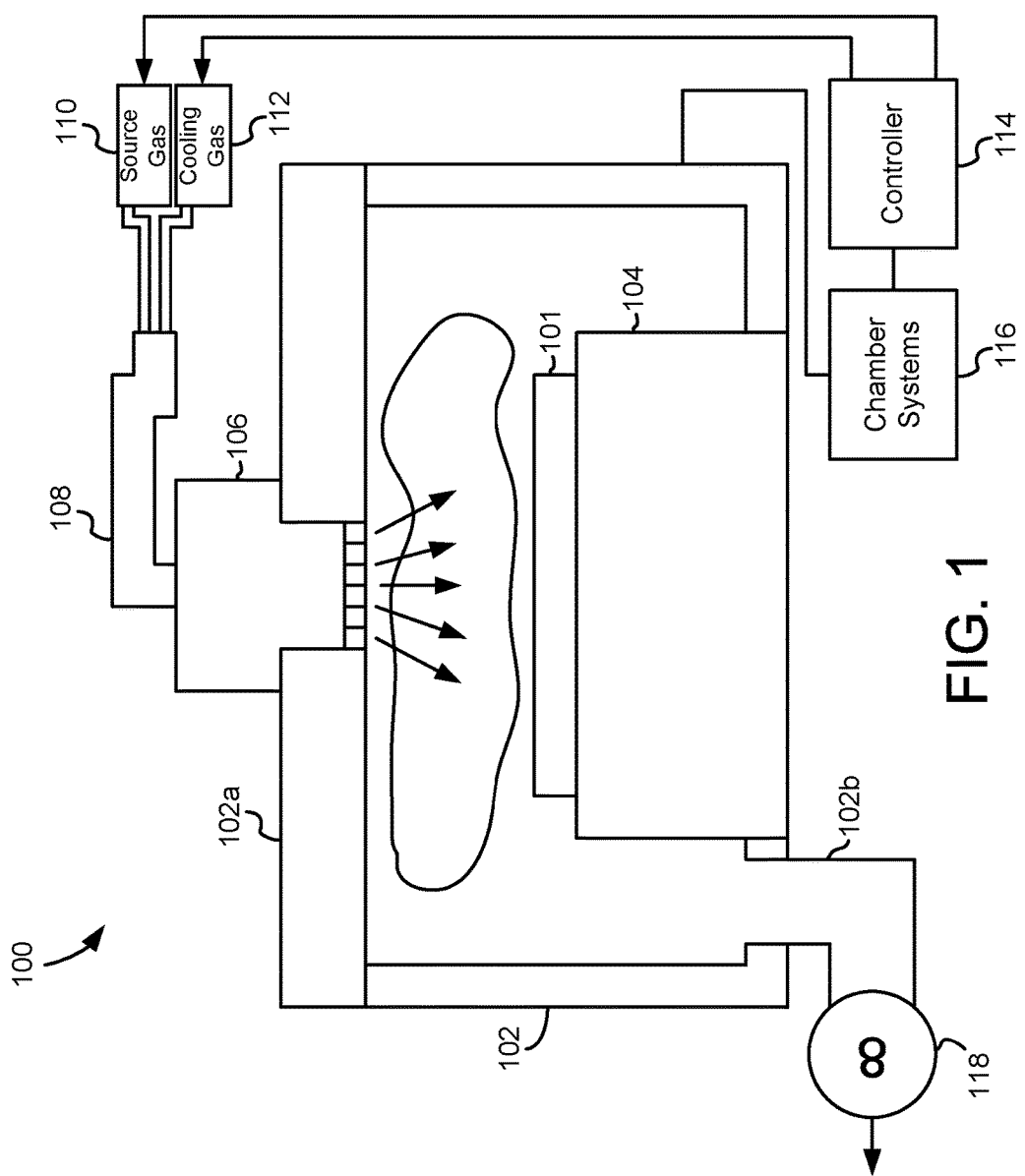
FIG. 1 is a simplified schematic diagram that illustrates a substrate processing system used to process a substrate, in accordance with an example embodiment.

FIG. 1 is a simplified schematic diagram that illustrates a substrate processing system 100, which is used to process a substrate 101. In one embodiment, the substrate is a silicon wafer. The system includes a chamber 102 having a chamber lid 102a. Substrate support 104, which is disposed on the bottom of chamber 102, provides support for substrate 101. Depending upon the processing being performed, and by way of example, the substrate support 104 can be a pedestal or an electrostatic chuck (ESC). It will be appreciated by those skilled in the art that the substrate support 104 can be provided with edge rings or carrier rings (not shown) to meet the needs of specific processing applications.

As shown in FIG. 1, ammonia radical generator 106 is disposed on chamber lid 102a of chamber 102. Ammonia radical generator 106 is coupled in flow communication with gas manifold 108, which receives source gas from gas source 110 and cooling gas from gas source 112. Each of gas sources 110 and 112 can be connected in flow communication with an appropriate gas facility. Ammonia radical generator 106 generates ammonia radicals which flow into the processing region of chamber 102. Additional details regarding the operation of ammonia radical generator 106 are set forth below with reference to FIGS. 2 and 3. It will be appreciated by those skilled in the art that, in addition to the ammonia radicals, other process gases (not shown) can be flowed into the chamber 102 to meet the needs of specific processing applications. In the case where other process gases are used, chamber 102 will need to be provided with appropriate valving and mass flow control mechanisms to ensure that the correct gases are delivered during processing.

Substrate processing system 100 also includes controller 114, which is configured to control operation of the substrate processing system. By way of example, controller 114 can execute process recipes, such as power levels, timing parameters, process gases, mechanical movement of the substrate 101, etc., to deposit or form films over the substrate. As shown in FIG. 1, controller 114 is coupled to chamber systems 116, gas source 110, and gas source 112. Chamber systems 116 can include various facilities and parameters associated with operation of the system 100 including, by way of example, power supplies, process gases, voltages, currents, temperatures, and pressures. Gas sources 110 and 112 are controlled to ensure proper operation of the ammonia radical generator 106 and thereby the introduction of the desired amount of ammonia radicals into the processing region of chamber 102.

Any ammonia radicals and process gases not consumed during processing exit the chamber 102 via a suitable outlet 102b. A vacuum pump 118 (e.g., a one or two stage mechanical dry pump and/or a turbomolecular pump) draws the ammonia radicals and process gases out and maintains a suitably low pressure within the chamber 102 by a closed loop controlled flow restriction device, such as a throttle valve or a pendulum valve.

Figure 2:
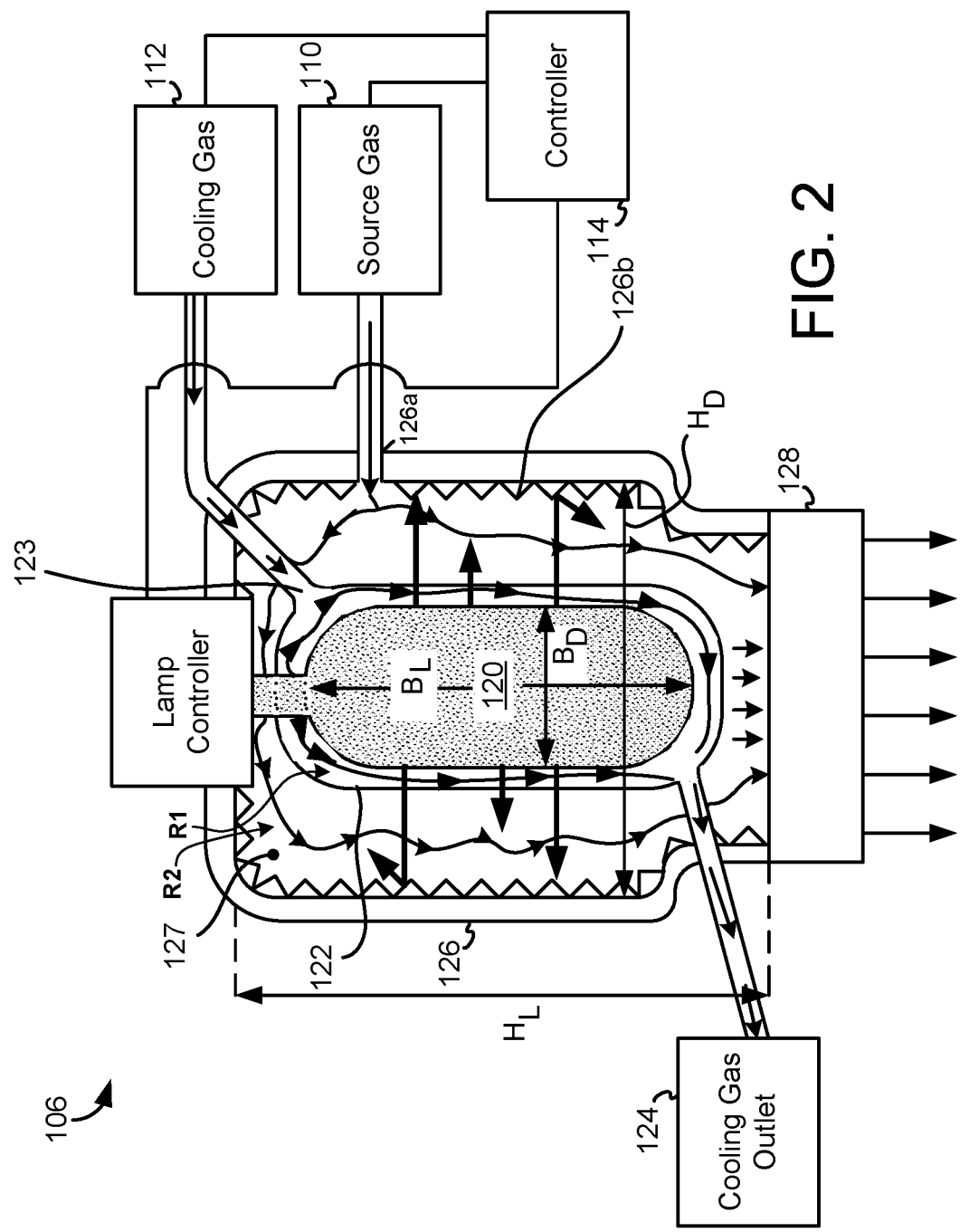
FIG. 2 is a simplified schematic diagram that illustrates additional details of the ammonia radical generator shown in FIG. 1, in accordance with an example embodiment.

FIG. 2 is a simplified schematic diagram that illustrates additional details of ammonia radical generator 106 shown in FIG. 1, in accordance with an example embodiment. As shown in FIG. 2, ammonia radical generator 106 includes a high power ultraviolet (UV) bulb 120 centrally disposed in the ammonia radical generator. The UV bulb 120 has a bulb length $B_L$ and a bulb diameter $B_D$. In one embodiment, the UV bulb 120 has a cylindrical configuration that is symmetrical around a central axis that runs along the length of the UV bulb. With this configuration, the UV bulb 120 emits optical energy axisymmetrically. The UV bulb 120 can be any suitable commercially available UV bulb, e.g., a filament-based bulb or a fluorescent (mercury-type) bulb. The UV bulb 120 can be powered by any suitable source of power, for example, direct current (DC) electrical power or alternating current (AC) electrical power. By way of example, the AC electrical power can be radio frequency (RF) power or microwave power. Lamp controller 121, which is connected to controller 114, controls the operation of the UV bulb 120, e.g., power, on/off state, etc.

The UV bulb 120 is surrounded by a separator wall 122 that is formed of a solid material that is transparent to UV energy. In one embodiment, the separator wall 122 is formed of quartz. In this example, the quartz must be able to transmit to UV-C (shortwave UV) wavelengths of 200 nanometers to 254 nanometers. In one embodiment, the separator wall 122 has a cylindrical configuration that defines a cooling tube that surrounds the UV bulb 120 and enables cooling gas to flow through the region defined therebetween. The cooling gas acts to cool the surface 120a of the UV bulb 120. In one embodiment, the cooling gas is dry nitrogen. The use of dry nitrogen is preferred relative to dry air because nitrogen molecular bonds do not break selectively at the UV frequencies typically used in the ammonia radical generator 106. In one embodiment, the UV bulb 120 emits UV energy having a wavelength of approximately 220 nanometers. In another embodiment, the UV energy has a wavelength in the range from 200 nanometers to 254 nanometers. At this frequency (or range of frequencies), the nitrogen cooling gas does not absorb any significant amount of UV and, consequently, the UV energy emitted by UV bulb 120 passes right through the curtain of cooling gas without incurring any significant energy loss.

As shown in FIG. 2, the cooling gas flows from gas source 112 into the region defined between the inner surface of separator wall 122 and the surface 120a of UV bulb 120 through inlet 123. As the cooling gas flows along the surface 120a of the UV bulb 120, the cooling gas absorbs heat from the surface of the UV bulb and thereby controls the temperature of the UV bulb. In this regard, the flow rate of the cooling gas can be scaled up or down depending upon the size of the UV bulb 120. In one embodiment, the cooling gas provides sufficient cooling to handle a thermal load of at least 21 $W/cm^2$. After passing over the length of the UV bulb 120, the cooling gas exits the ammonia radical generator 106 via cooling gas outlet 124.

The separator wall 122 is surrounded by housing 126, which may be formed of any suitable solid material. In one embodiment, the housing 126 is formed of stainless steel. The housing 126, which has a length $H_L$ and an inner major dimension $H_M$, encloses an inner volume 127. The length HL and the inner major dimension HM of the housing 126 are selected so that the size of the housing is sufficiently large to accommodate the UV bulb 120. The housing 126 is coaxially aligned with the UV bulb 120 and surrounds the separator wall 122 so that a region is defined between the housing and the separator wall. In one embodiment, this region is a cylindrical plenum. The source gas flows from gas source 110 and enters the region, e.g., a cylindrical plenum, defined between housing 126 and separator wall 122. In one embodiment, the source gas is ammonia ($NH_3$). In one embodiment, the source gas is introduced into inlet 126a of housing 126 and is circumferentially distributed by a distribution plenum that guides the source gas into the cylindrical plenum. Once in the cylindrical plenum, the source gas flows past the surface 120a of UV bulb 120 and exits the generator 106 through outlet 128, which includes a suitable number of holes through which the source gas can flow.

One advantage of the ammonia generator 106 is that the configuration of the generator is extremely compact, which makes the generator easy to fit into reactor designs. In one embodiment, the length $H_L$ of housing 126 is in the range of from 152.4 mm to 228.6 mm and the diameter of the outlet 128 is in the range of from 50.8 mm to 101.6 mm. It will be appreciated by those skilled in the art that these dimensions can be varied to meet the need of specific applications.

In operation, UV energy emanates from UV bulb 120 and passes through the cooling gas (e.g., nitrogen) and the separator wall 122 (made of, for example, quartz) into the region, e.g., a cylindrical plenum, defined between the housing 126 and the separator wall. The source gas (e.g., ammonia) flowing through this region interacts with and absorbs UV energy and breaks up into smaller compounds. In the case of ammonia, the UV energy breaks the ammonia into a gas mix of ammonia radicals (NH*) and diatomic hydrogen ($H_2$). This gas mix (ammonia radicals and hydrogen) then exits the generator 106 through the outlet 128 and flows to a downstream region of interest, e.g., a processing region of a chamber (see, for example, chamber 102 shown in FIG. 1).

As a portion of the UV energy may not be absorbed by the ammonia, the inner surface 126b of the housing 126 reflects UV energy back into the stream of ammonia gas. In this manner, the unabsorbed UV energy is passed through the ammonia gas stream for a second time. In one embodiment, the inner surface 126b of the housing 126 is rendered reflective by subjecting the inner surface to an appropriate surface finishing treatment. In another embodiment, a reflective coating material is provided on the inner surface 126b. In one embodiment, the reflective coating material is formulated to reflect UV energy (e.g., UV-C (shortwave UV) having a wavelength of approximately 220 nanometers) back toward the separator wall 122. Notwithstanding the reflective inner surface 126b of the housing 126, some portion of the UV energy that reaches the inner surface may be absorbed by the housing wall. If the power associated with the UV energy is high enough, it may be necessary to cool the housing 126 with, for example, dry nitrogen.

Figure 3:
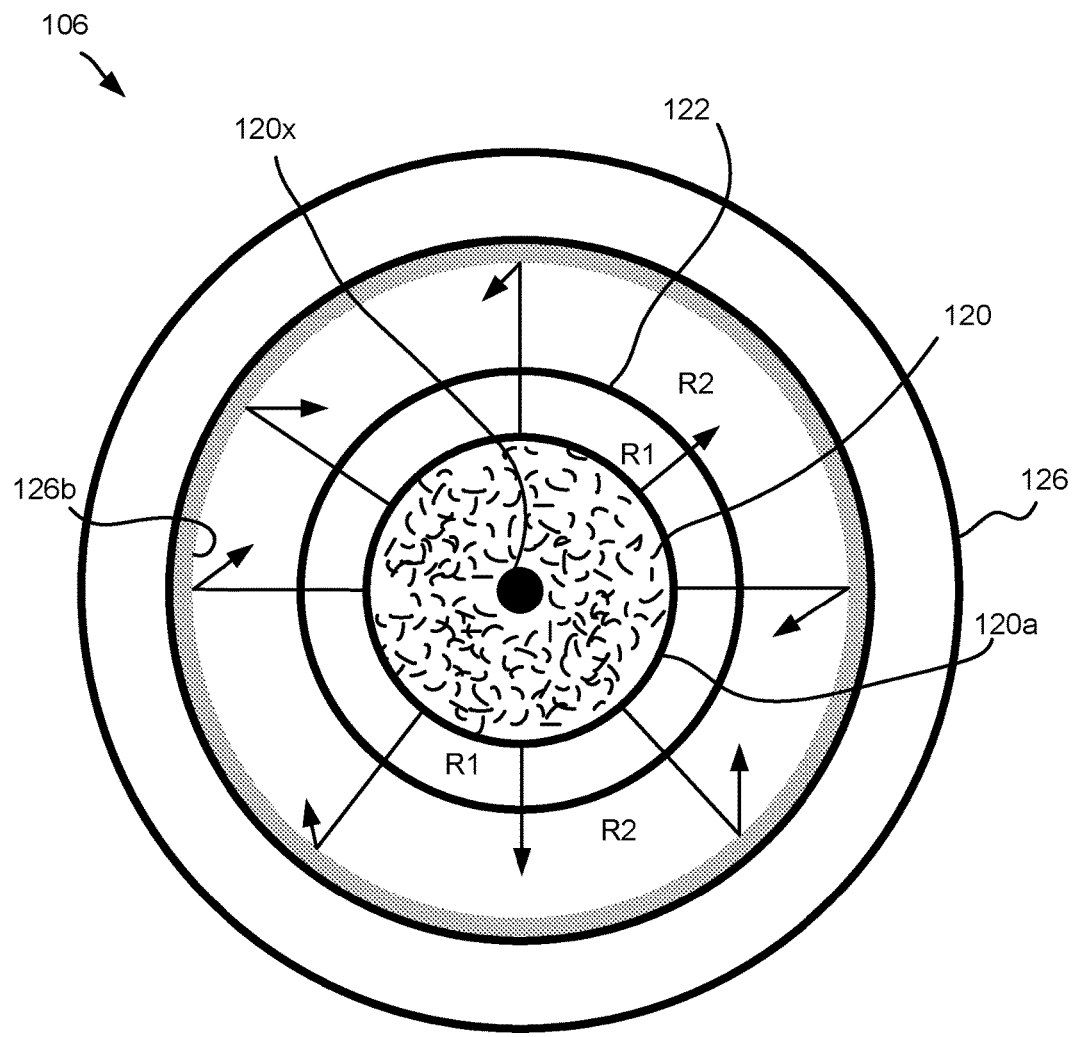
FIG. 3 illustrates a simplified cross-sectional view of an ammonia radical generator, in accordance with an example embodiment.

FIG. 3 illustrates a simplified cross-sectional view of an ammonia radical generator, in accordance with an example embodiment. As shown in FIG. 3, UV bulb 120, separator wall 122, and housing 126 are coaxially aligned with central axis 120x. A first region R1 is defined between the surface 120a of UV bulb 120 and the separator wall 122. A second region R2 is defined between the separator wall 122 and the inner surface 126b of housing 126. In one embodiment, the separator wall 122 has a cylindrical configuration that forms a cooling tube that surrounds the UV bulb 120. In one embodiment, the second region R2 is a cylindrical plenum.

The UV energy from UV bulb 120 emanates axisymmetrically from the bulb around central axis 120x (as indicated by the arrows in FIG. 3). Cooling gas (e.g., $N_2$) flows in the first region R1 and the source gas (e.g., ammonia) flows in the second region R2. The UV energy from UV bulb 120 passes through the curtain of cooling gas in region R1 as well as the separator wall 122 and enters the second region R2. A portion of the ammonia gas stream flowing through the second region R2 interacts with and absorbs UV energy and this absorbed energy causes the ammonia gas to break up into NH* radicals and $H_2$, as discussed above. The portion of the UV energy that is not absorbed by the ammonia gas stream reaches the inner surface 126b of the housing 126 and is reflected back into the ammonia gas stream because the inner surface is reflective. As such, the reflective inner surface 126b of the housing 126 increases the efficiency of the generator 106 by providing a second opportunity for the UV energy to be absorbed by the ammonia gas stream.

Figure 4:
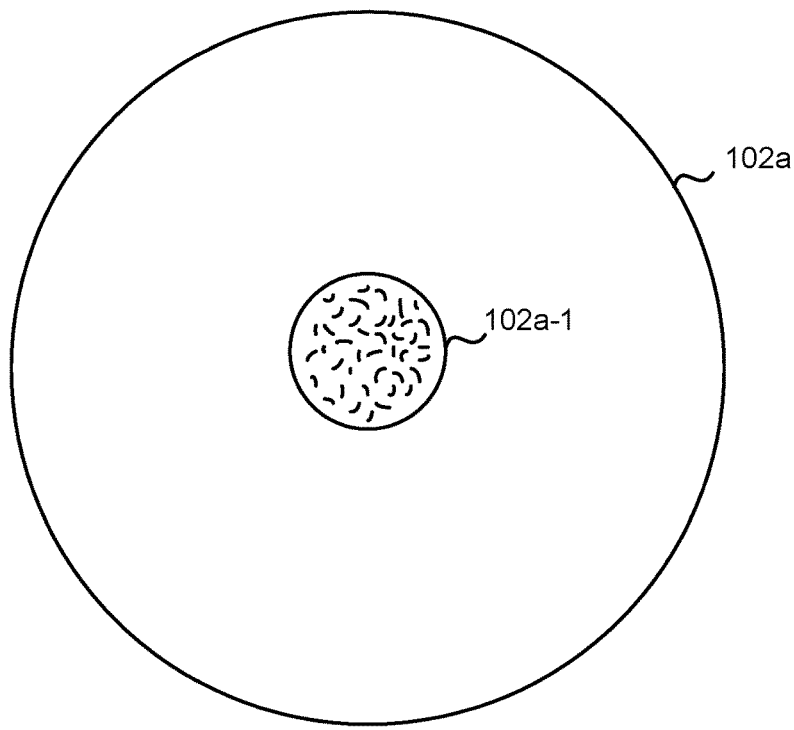
FIG. 4 illustrates a simplified view of the underside of a chamber lid, in accordance with an example embodiment.

FIG. 4 illustrates a simplified view of the underside of a chamber lid, in accordance with an example embodiment. As shown in FIG. 4, chamber lid 102a has a single opening 102a-1 formed in the central portion of the chamber lid. In one embodiment, the opening 102a-1 has a circular configuration and is located in the center of chamber lid 102a. The opening 102a-1 enables the gas mix of NH* radicals and $H_2$ exiting from an ammonia radical generator 106 mounted on the topside of chamber lid 102a (see, for example, FIG. 1) to flow into the processing region of a chamber, e.g., chamber 102 shown in FIG. 1. A chamber configured to accommodate a single ammonia radical generator is suitable for carrying out processing that does not require a precise level of uniformity, e.g., low energy pretreatments for copper oxidation.

Figure 5:
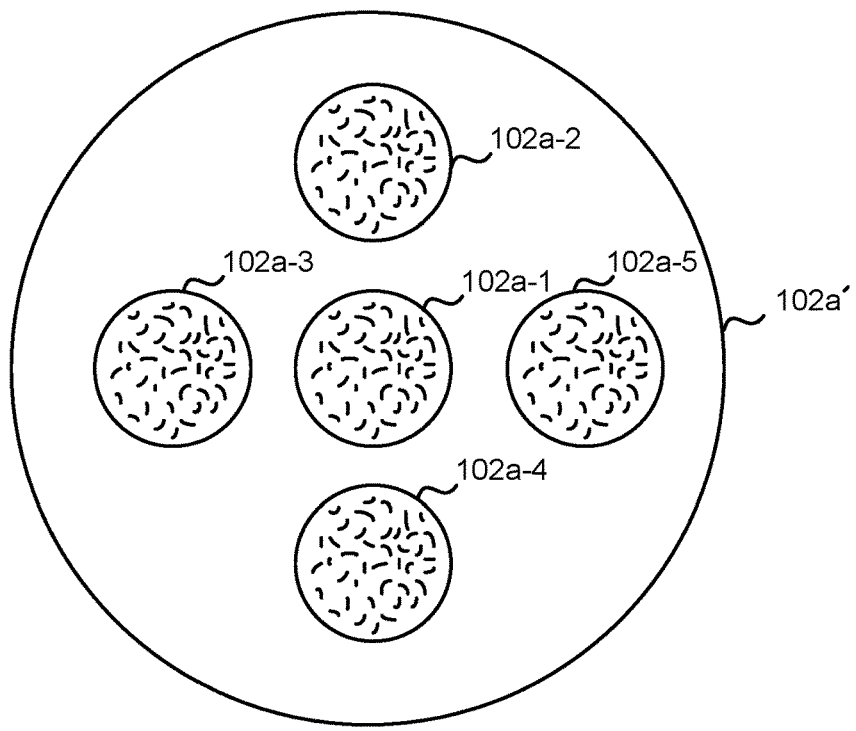
FIG. 5 illustrates a simplified view of the underside of a chamber lid, in accordance with another example embodiment.

FIG. 5 illustrates a simplified view of the underside of a chamber lid, in accordance with another example embodiment. As shown in FIG. 5, chamber lid 102a' has an opening 102a-1 formed in the central portion of the chamber lid and four additional openings 102a-2, 102a-3, 102a-4, and 102a-5 symmetrically disposed about opening 102a-1. It will be appreciated by those skilled in the art that the number of additional openings can be varied to be higher or lower than four to meet the needs of specific processing applications. In one embodiment, the opening 102a-1 has a circular configuration and is located in the center of chamber lid 102a'. In one embodiment, each of the openings 102a-2, 102a-3, 102a-4, and 102a-5 has a circular configuration and these openings are disposed about central opening 102a-1 at 90-degree intervals. The openings 102a-1 thru 102a-5 enable the gas mix of NH* radicals and $H_2$ exiting from each of the corresponding ammonia radical generators mounted on the topside of a chamber lid to flow into the processing region of a chamber. A chamber configured to accommodate multiple ammonia radical generators is suitable for carrying out processing that requires a more precise level of uniformity, e.g., a low energy deposition process.

Figure 6:
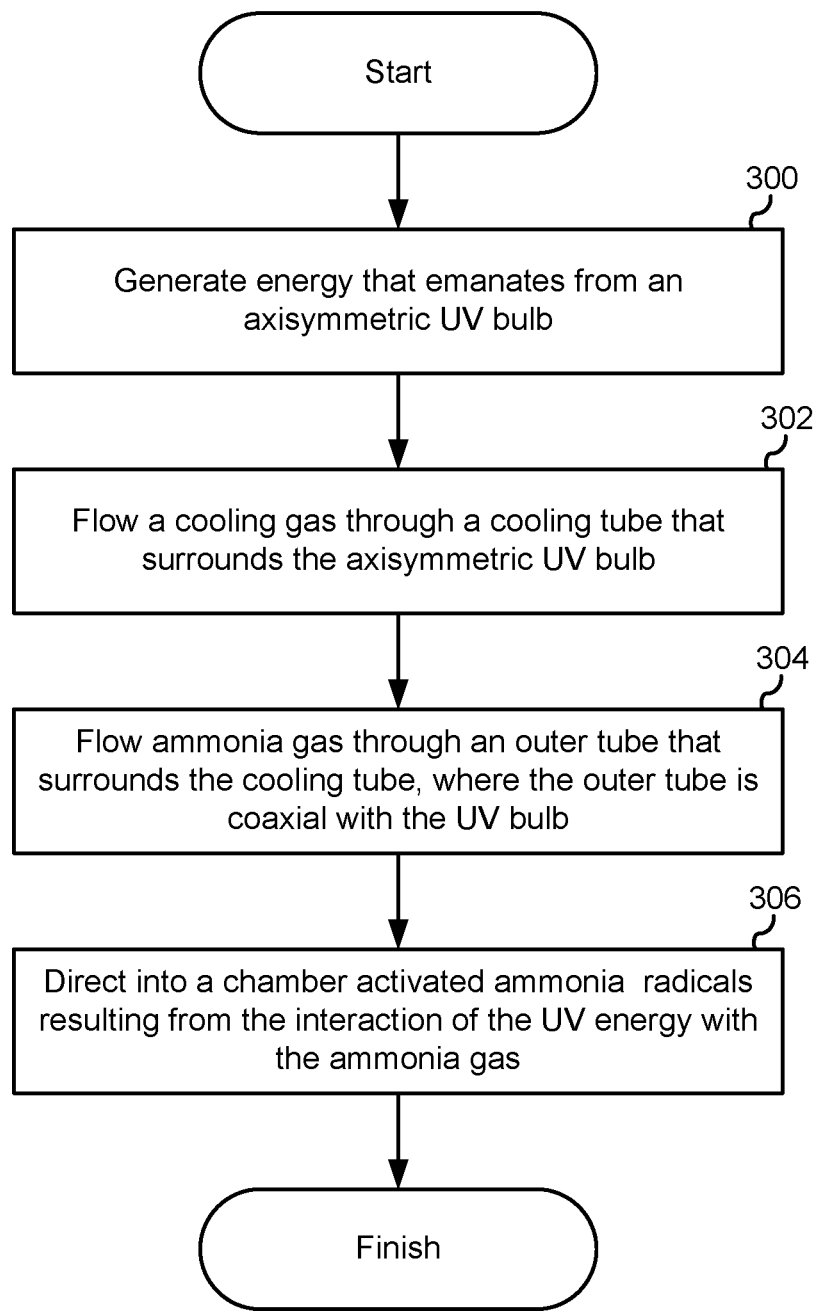
FIG. 6 is a flowchart diagram that illustrates the method operations performed in generating activated ammonia radicals, in accordance with an example embodiment.

FIG. 6 is a flowchart diagram that illustrates the method operations performed in generating activated ammonia radicals, in accordance with an example embodiment. Operation 300 includes generating ultraviolet (UV) energy that emanates from an axisymmetric UV bulb. In one embodiment, the UV bulb has a cylindrical configuration as shown in FIG. 1 (see UV bulb 120). Operation 302 includes flowing a cooling gas through a cooling tube that surrounds the axisymmetric UV bulb. By way of example, the separator wall 122 shown in FIGS. 2 and 3 can be used as the cooling tube when the separator wall has a cylindrical configuration. In one embodiment, the cooling tube is formed of a solid material that is transparent to UV energy, e.g., quartz. In one embodiment, the cooling gas is dry nitrogen.

Operation 304 includes flowing ammonia gas through an outer tube that surrounds the cooling tube. The outer tube and the UV bulb are arranged so that the outer tube is coaxial with the UV bulb. In one embodiment, the outer tube is made of stainless steel and has a reflective inner surface. By way of example, the housing 126, which has an inner surface 126 that is reflective (see, for example, FIG. 2), can be used as the outer tube that surrounds the cooling tube. Operation 306 includes directing into a chamber the activated ammonia radicals resulting from the interaction of the UV energy with the ammonia gas. As discussed above, when the UV energy interacts with the ammonia gas, the ammonia breaks up into a gas mix that includes ammonia radicals (NH*) and diatomic hydrogen ($H_2$). In one embodiment, the activated ammonia radicals (and the hydrogen) are directed into the chamber through an outlet that is disposed in an opening formed in a chamber lid of the chamber. Once they have been directed into the chamber, the activated ammonia radicals can be used in the chamber to process a semiconductor substrate (e.g., a low energy pretreatment for copper oxidation, a low energy deposition, etc.).

In the example embodiments described herein, a cooling gas is used to control the temperature of the UV bulb. It is to be understood, however, that use of a cooling gas is optional. Thus, the use of the cooling gas can be omitted. In situations where a cooling gas is not used, those skilled in the art will appreciate that the separator wall (reference number 122 in FIGS. 2 and 3) or the cooling tube (referred to in operation 302 of FIG. 6) can also be omitted.

Further, in the example embodiments described herein, ammonia is used as the source to generated a gas mix including activated ammonia radicals (NH*) and hydrogen. It will be appreciated by those skilled in the art that other source gases can be used to generate other desired chemistries through interaction with UV energy. By way of example, hydrogen fluoride (HF) vapor can be used to generate fluorine, alcohol can be used to generate C—O—H hydroxyl groups, and oxygen ($O_2$) can be used to generate ozone ($O_3$).

Figures 7A, 7B:
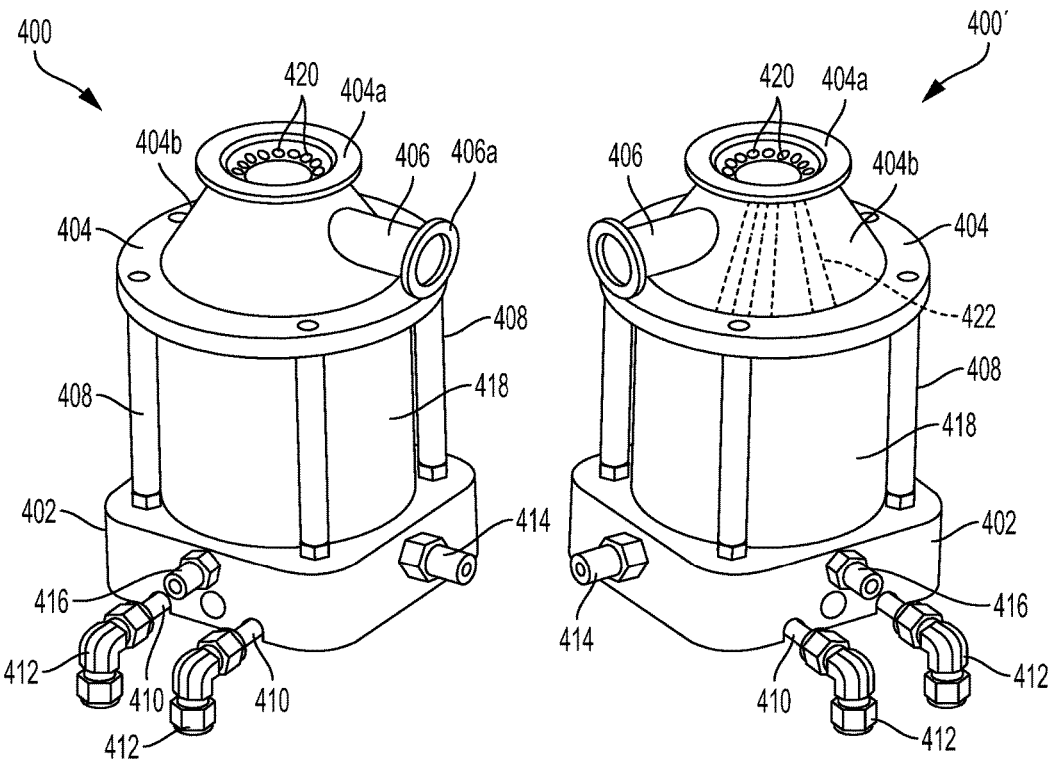
FIG. 7A is a perspective view of an ammonia radical generator, in accordance with another example embodiment.
FIG. 7B is a perspective view of an ammonia radical generator, in accordance with yet another example embodiment.

FIG. 7A is a perspective view of an ammonia radical generator, in accordance with another example embodiment. As shown in FIG. 7A, ammonia radical generator 400 includes a base 402 and a top cover 404, which includes a tube 406 having a flange 406a affixed the end thereof. A plurality of supports 408 is provided to separate the top cover 404 and the base 402. In one embodiment, the ammonia radical generator includes four supports; however, the number of supports may be varied to meet the needs of specific applications. In one embodiment, the lower ends of the supports 408 are disposed in holes formed in the base 402 and the upper ends of the supports are disposed in holes formed in the top cover 404. In one embodiment, suitable fasteners, e.g., bolts, are used to secure the upper ends of the supports in the holes formed in top cover 404. The base 402 includes a cooling water tube 410 that is disposed in a channel formed in the base. Fittings 412 are provided at the ends of the cooling water tube 410. The base 402 is also provided with a nitrogen inlet 414 and an ammonia inlet 416, each of which will be described in more detail below. An outer enclosure 418 surrounds the internal components of the ammonia radical generator 400. Additional details regarding the internal components will be described in more detail below with reference to FIGS. 8-13.

In one embodiment, the base 402 and the top cover 404 are formed of an aluminum-based material, e.g., an AL-6061 alloy. Those skilled in the art will appreciate that other suitable materials also may be used. For example, in the case of the top cover 404, the radical collector portion of the top cover could be formed of a ceramic material, e.g., aluminum oxide ($Al_2O_3$) or aluminum nitride (AlN), to either prevent or significantly reduce the likelihood of recombination of the ammonia radicals, as will be explained in more detail below. In one embodiment, the outer enclosure 418 is formed of a standard pipe material, e.g., 4.5 OD Schedule-5 stainless steel pipe. In one embodiment, the nitrogen inlet is a ½-20 UNF-2B SAE straight thread with an O-ring. In one embodiment, the ammonia inlet is a ⅜-24 UNF-2B SAE straight thread with an O-ring. In one embodiment, the flange 406a is an NW 25 flange welded to the end of tube 406.

FIG. 7B is a perspective view of an ammonia radical generator, in accordance with yet another example embodiment. In the ammonia radical generator 400' shown in FIG. 7B, the plumbing in the base 402 (namely, the cooling tube 410 and the fittings 412) is configured so that the fittings 412 are situated on the right hand side of the tube 406, where the relative orientation of the fittings is determined when looking into the opening of the tube. In contrast, in the ammonia radical generator 400 shown in FIG. 7A, the plumbing in the base 402 is configured so the fittings 412 are situated on the left hand side of the tube 406 (as determined when looking into the opening of the tube). Thus, those skilled in the art will appreciate that the configuration of the plumbing in the base 402 can be varied to meet the needs of different applications.

As shown in both FIGS. 7A and 7B, the top portion 404a of top cover 404 defines an outlet that is provided with a plurality of regularly spaced openings 420. The openings 420 constitute the ends of channels 422 that have been machined, e.g., drilled, into the sloped portion 404b of the top cover 404 to provide pathways for the ammonia radicals to exit via the outlet, as will be explained in more detail below. As shown in FIG. 7B, the channels 422 defined in the sloped portion 404b of the top cover 404 are indicated by dashed lines. In one embodiment, the outlet defined by the top portion 404a of the top cover 404 is a standard NW 25 interface that can be readily connected to a process chamber.

Figure 8:
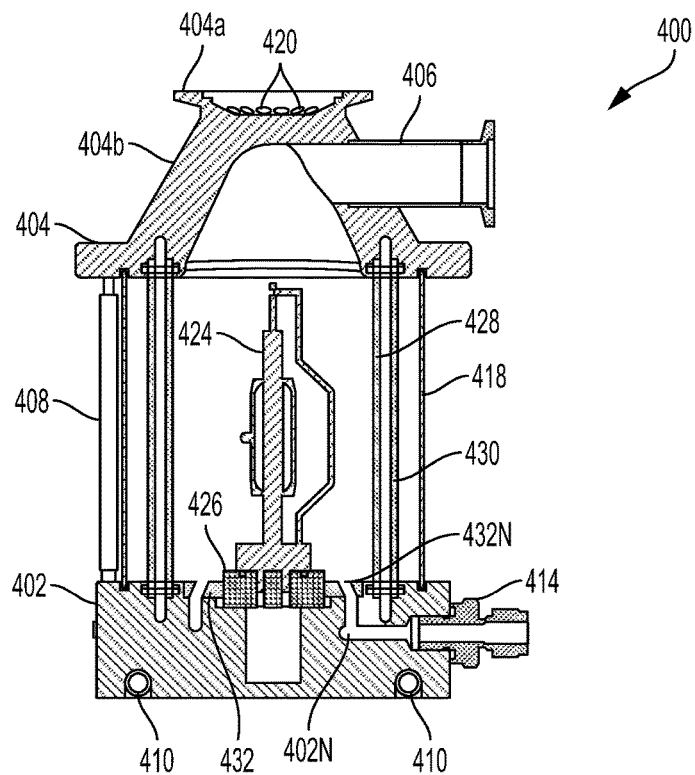
FIG. 8 illustrates a cross-sectional view of the ammonia radical generator shown in FIG. 7A, in accordance with an example embodiment.

FIG. 8 illustrates a cross-sectional view of the ammonia radical generator 400 shown in FIG. 7A, in accordance with an example embodiment. The cross-sectional view shown in FIG. 8 is taken along a plane that cuts through the centerline of the tube 406 shown in FIG. 7A. As shown in FIG. 8, the interior of ammonia radical generator 400 includes UV lamp 424, which is mounted in socket 426 disposed on base 402. In one embodiment, the UV lamp is a mercury metal-halide lamp operating at 230 volts, 8.5 amps and producing a 400 W output at a wavelength in the range of 220 to 1,000 nanometers. The UV lamp 424 is generally centered within inner cylinder 428. In one embodiment, the inner cylinder 428 is formed of a quartz material that has at least 90% transmissivity to UV-C energy having a wavelength in the range from 200 nanometers to 220 nanometers. In one embodiment, the inner cylinder 428 is formed of GE 021 fused quartz, which is commercially available from Momentive Performance Materials, Inc. of Waterford, N.Y. The inner cylinder 428 is surrounded by an outer cylinder 430.

In one embodiment, the outer cylinder 430 is concentric with the inner cylinder 428. In one embodiment, the outer cylinder is comprised of a quartz material that reflects UV-C energy having a wavelength in the range from 200 nanometers to 220 nanometers. In one embodiment, the outer cylinder 430 is formed of GE 219 fused quartz, which is commercially available from Momentive Performance Materials, Inc. of Waterford, N.Y. Thus, UV-C energy rays that reach the inner surface of outer quartz cylinder 430 will bounce back toward the center of the ammonia radical generator 400.

The UV lamp 424 is cooled using a directionally focused stream of cooling gas, e.g., nitrogen ($N_2$), with the focal point of the stream being the center of the UV lamp. The use of nitrogen as the cooling gas advantageously prevents the buildup of ozone ($O_3$) because ozone is exhausted to the facility as part of the cooling exhaust gas. The nitrogen cooling gas is provided to the ammonia radical generator 400 via nitrogen inlet 414, which is coupled in flow communication to a suitable nitrogen facility. The nitrogen cooling gas is guided from the nitrogen inlet 414 through the base 402 by a channel 402N. The channel 402N guides the nitrogen cooling gas toward a cover plate 432, which is situated on the top surface of the base 402 within the region bounded by the inner cylinder 428. The cover plate 432 is provided with a plurality of holes 432N that guide the nitrogen cooling gas into the region bounded by the inner cylinder 428. As shown in FIG. 8, the holes 432N formed in the base 402 are configured to direct nitrogen cooling gas toward the center of the UV lamp 424. In one embodiment, the holes 432N are formed in the base 402 at an angle that is aligned with the central portion of the UV lamp 424. In addition, the water cooling of the base 402 by cooling water tube 410 disposed therein transfers some of the heat from socket 426 away from the base.

FIGS. 9A and 9B illustrate exploded cross-sectional views of the ammonia radical generator 400 shown in FIG. 7A, in accordance with an example embodiment. The exploded cross-sectional view shown in FIG. 9A is taken along a plane that is perpendicular to the centerline of the tube 406 shown in FIG. 7A. The exploded cross-sectional view shown in FIG. 9B is taken along a plane that cuts through the centerline of the tube 406 shown in FIG. 7A. As shown in both FIGS. 9A and 9B, top cover 404 includes annular groove 404G for receiving the top end of outer enclosure 418 and base 402 includes annular groove 402G for receiving the bottom end of the outer enclosure. As shown in FIG. 9A, channel 402A formed in base 402 is in flow communication with ammonia inlet 416 and has an annular configuration so as to direct ammonia gas into the chamber space defined between outer cylinder 430 and inner cylinder 428. As shown in FIG. 9B, channel 402N formed in base 402 is in flow communication with nitrogen inlet 414 and has an annular configuration so as to direct nitrogen cooling gas toward cover plate 432, as described above with reference to FIG. 8. As shown in both FIGS. 9A and 9B, top cover 404 has a channel 404R formed therein. Channel 404R has an annular configuration and functions to receive ammonia radicals from the chamber space defined between outer cylinder 430 and inner cylinder 428 and guide the ammonia radicals into channels formed in the sloped portion 404b of top cover 404, as described in more detail with reference to FIGS. 12A and 12C.

Figure 10A:
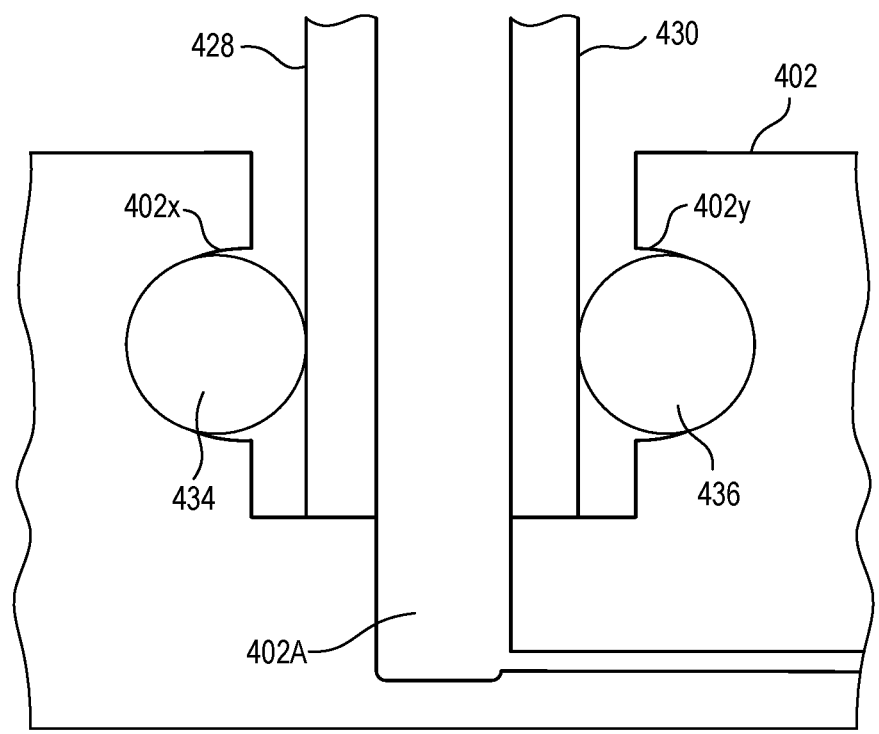
FIG. 10A illustrates additional details of the interface between the inner and outer cylinders and the base, in accordance with an example embodiment.

FIG. 10A illustrates additional details of the interface between the inner and outer cylinders and the base, in accordance with an example embodiment. As shown in FIG. 10A, a fluid sealing member 434 is provided adjacent to the inner surface of inner cylinder 428 proximate to the end of the inner cylinder that is in contact with a surface of base 402. A fluid sealing member 436 is provided adjacent to the outer surface of outer cylinder 430 proximate to the end of the outer cylinder that is in contact with the surface of base 402. Fluid sealing members 434 and 436 function to seal the lower ends of inner cylinder 428 and outer cylinder 430, respectively. As shown in FIG. 10A, fluid sealing member 434 is disposed in recess 402X defined in base 402 and fluid sealing member 436 is disposed in recess 402Y defined in the base. Those skilled in the art will appreciate that the use of a recess is just one example of a suitable technique for holding a fluid sealing member in place and that other techniques also may be used. In one embodiment, fluid sealing members 434 and 436 are O-rings. By way of example, other suitable fluid sealing members that can be used include X-rings, gaskets, sealing rings, etc.

Figure 10B:
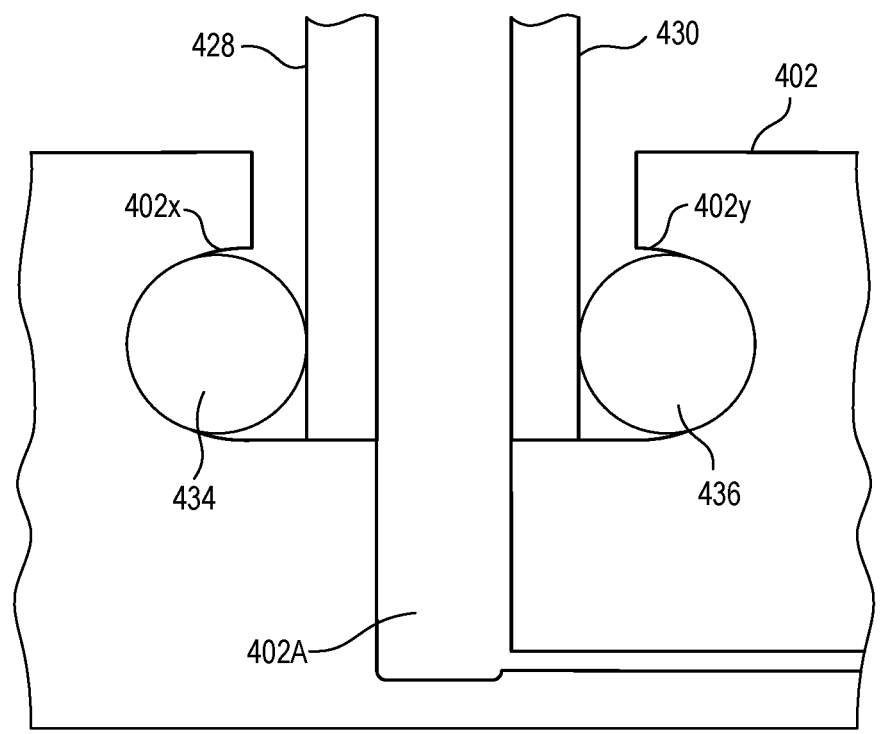
FIG. 10B illustrates additional details of the interface between the inner and outer cylinders and the base, in accordance with another example embodiment.

FIG. 10B illustrates additional details of the interface between the inner and outer cylinders and the base, in accordance with another example embodiment. As shown in FIG. 10B, fluid sealing member 434 is provided directly adjacent to the end of inner cylinder 428 that is in contact with a surface of base 402. Fluid sealing member 436 is provided directly adjacent to the end of outer cylinder 430 that is in contact with the surface of base 402. Those skilled in the art will appreciate that the configuration of the interface between the inner and outer cylinders and the base can be varied from that shown in FIGS. 10A and 10B to meet the needs of particular applications.

Figure 11A:
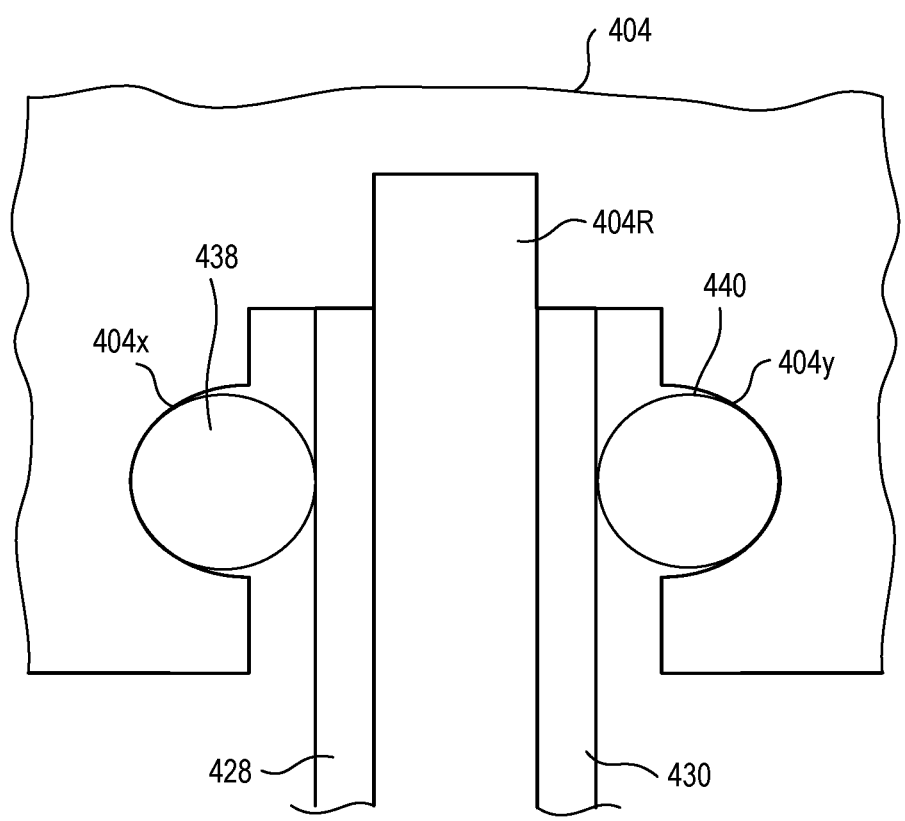
FIG. 11A illustrates additional details of the interface between the inner and outer cylinders and the top cover, in accordance with an example embodiment.

FIG. 11A illustrates additional details of the interface between the inner and outer cylinders and the top cover, in accordance with an example embodiment. As shown in FIG. 11A, a fluid sealing member 438 is provided adjacent to the inner surface of inner cylinder 428 proximate to the end of the inner cylinder that is in contact with a surface of top cover 404. A fluid sealing member 440 is provided adjacent to the outer surface of outer cylinder 430 proximate to the end of the outer cylinder that is in contact with the surface of top cover 404. Fluid sealing members 438 and 440 function to seal the upper ends of inner cylinder 428 and outer cylinder 430, respectively. As shown in FIG. 11A, fluid sealing member 438 is disposed in recess 404X defined in top cover 404 and fluid sealing member 440 is disposed in recess 404Y defined in the top cover. In one embodiment, fluid sealing members 438 and 440 are O-rings. As noted above, other suitable fluid sealing members also can be used, e.g., X-rings, gaskets, sealing rings, etc.

Figure 11B:
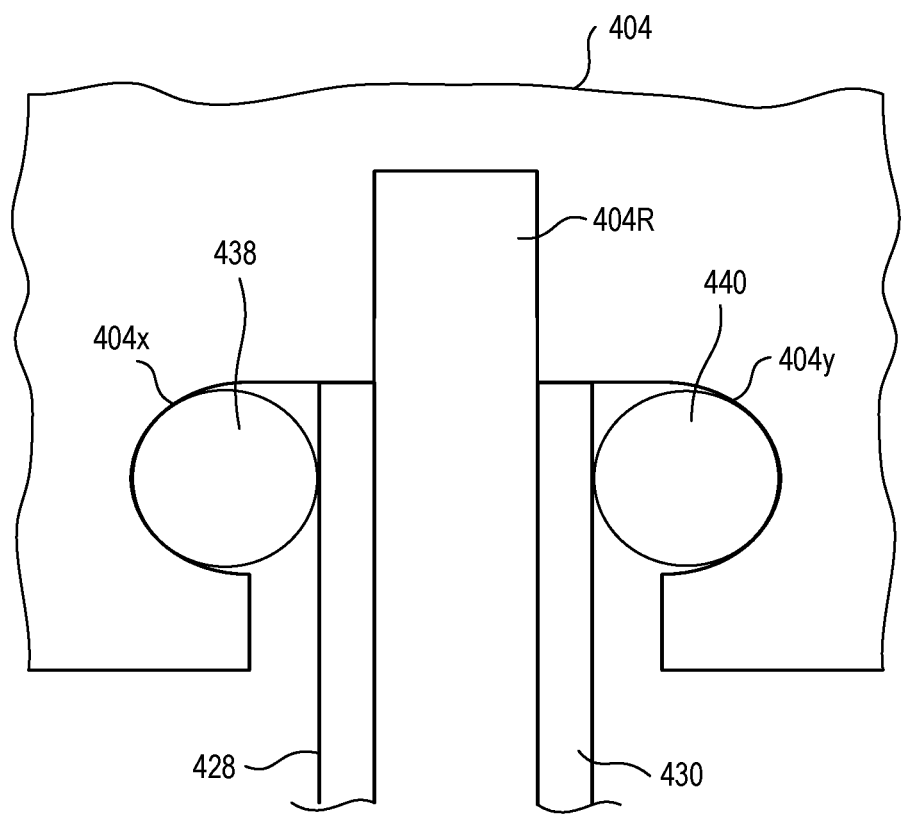
FIG. 11B illustrates additional details of the interface between the inner and outer cylinders and the base, in accordance with another example embodiment.

FIG. 11B illustrates additional details of the interface between the inner and outer cylinders and the base, in accordance with another example embodiment. As shown in FIG. 11B, fluid sealing member 438 is provided directly adjacent to the end of inner cylinder 428 that is in contact with a surface of top cover 404. Fluid sealing member 440 is provided directly adjacent to the end of outer cylinder 430 that is in contact with the surface of top cover 404. Those skilled in the art will appreciate that the configuration of the interface between the inner and outer cylinders and the top cover can be varied from that shown in FIGS. 11A and 11B to meet the needs of particular applications.

Figure 12B:
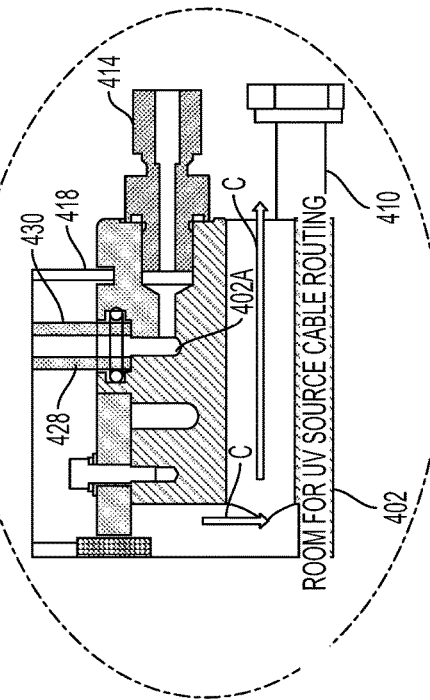
FIG. 12B shows an enlarged version of the region in FIG. 12A encircled by the dashed line.
Figure 12C:
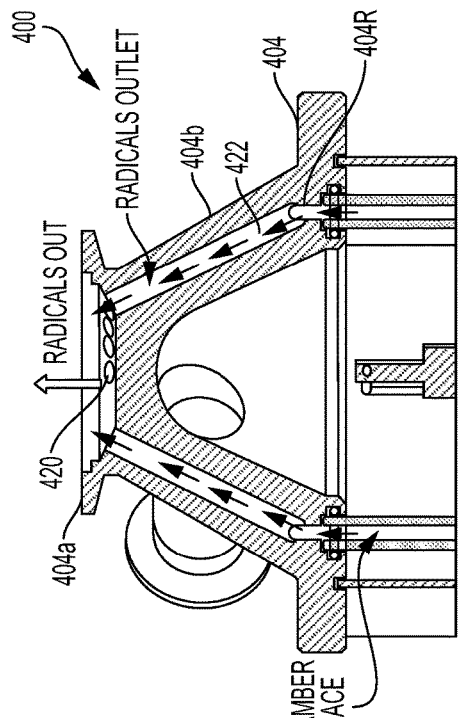
FIG. 12C is an enlarged cross-sectional view of the top section of an ammonia radical generator, in accordance with an example embodiment.
Figure 12A:
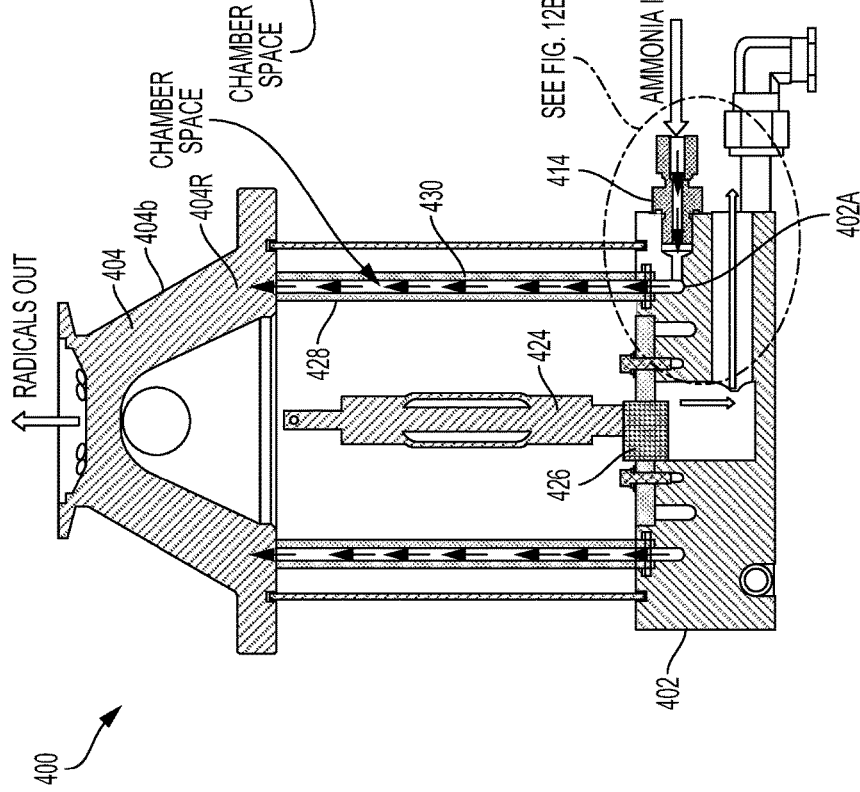
FIG. 12A is a cross-sectional view that illustrates the flow path of the ammonia gas/ammonia radicals through the ammonia radical generator, in accordance with an example embodiment.

FIG. 12A is a cross-sectional view that illustrates the flow path of the ammonia gas/ammonia radicals through the ammonia radical generator, in accordance with an example embodiment. As shown in FIG. 12A, ammonia gas enters the ammonia radical generator 400 via ammonia inlet 414 and flows into channel 402A. Channel 402A guides the ammonia gas into the chamber space defined between inner cylinder 428 and outer cylinder 430. FIG. 12B shows an enlarged version of the region in FIG. 12A encircled by the dashed line. As shown in FIG. 12B, space can be provided within base 402 to accommodate the cabling required for UV lamp 424 and socket 426 (see FIG. 12A). In the example embodiment shown in FIG. 12B, the cabling for the UV lamp and socket is routed along the path indicated by the arrows labeled "C."

Referring back to FIG. 12A now, as the ammonia gas flows in the chamber space (as indicated by the arrows pointed toward top cover 404), the ammonia gas is exposed to UV energy from UV lamp 424. In one embodiment, the UV energy from the UV lamp 424 to which the ammonia gas is exposed is UV-C energy having a wavelength of 220 nanometers because the inner cylinder 428 is made of a quartz-based material through which such UV-C can pass. Some of the UV-C energy that passes through the inner cylinder 428 is absorbed by the ammonia gas stream and this absorbed energy causes the ammonia gas to break up into ammonia radicals (NH*) and $H_2$. The UV-C energy that is not absorbed by the ammonia gas stream reaches the inner surface of outer cylinder 430. In one embodiment, the outer cylinder is made of a quartz-based material that reflects UV-C energy having a wavelength of 220 nanometers. Thus, the UV-C energy that is not absorbed by the ammonia gas stream gets reflected back into the ammonia gas stream. This increases the efficiency of the ammonia radical generator by affording the UV-C energy a second opportunity to get absorbed by the ammonia gas stream and thereby generate ammonia radicals (NH*).

The gas mix (ammonia radicals (NH*) and $H_2$) generated by exposure to UV-C energy while in the chamber space exits the chamber space and flows into channel 404R formed in top cover 404. Channel 404R has an annular configuration and guides the gas mix into a plurality of channels formed in the sloped portion 404b of top cover 404. FIG. 12C is an enlarged cross-sectional view of the top section of an ammonia radical generator, in accordance with an example embodiment. As shown in FIG. 12C, the gas mix flows from channel 404R into a plurality of channels 422 formed in the sloped portion 404b of top cover 404. The channels 422 guide the gas mix, which includes the ammonia radicals (NH*), out of the top cover 404 via openings 420 formed in the top portion 404a of the top cover. The openings 420 constitute the ends of the channels 422 defined in the top cover 404. In one embodiment, the lengths of the channels 422 are kept as short as possible to minimize any recombination of the ammonia radicals during passage through the channels. In another embodiment, the top cover 404 is formed of a ceramic material, e.g., aluminum oxide ($Al_2O_3$) or aluminum nitride (AlN), to either prevent or significantly reduce the likelihood of recombination of the ammonia radicals during passage through the channels formed in the top cover. When the outlet defined by the top portion 404a of the top cover 404 is connected to a process chamber, the ammonia radicals (NH*) exit the openings 420 and flow into the process chamber for use therein, e.g., as a pretreatment for the surface of a wafer.

Figure 13:
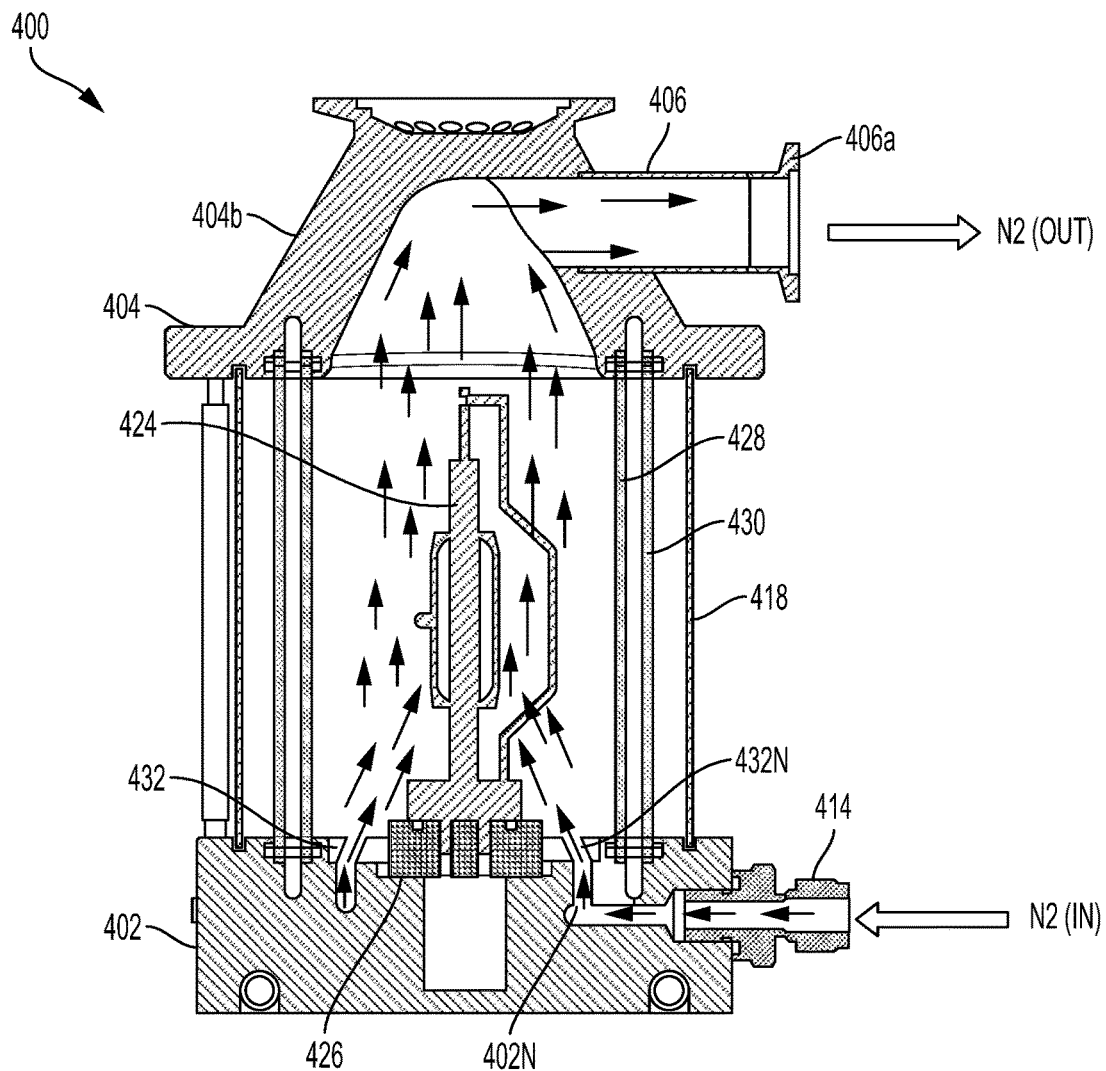
FIG. 13 is a cross-sectional view that illustrates the flow path of the cooling gas through the ammonia radical generator, in accordance with an example embodiment.

FIG. 13 is a cross-sectional view that illustrates the flow path of the cooling gas through the ammonia radical generator, in accordance with an example embodiment. As shown in FIG. 13, cooling gas, e.g., nitrogen ($N_2$), enters the ammonia radical generator from a suitable nitrogen gas facility at room temperature via nitrogen inlet 414. As described above with reference to FIG. 8, channel 402N defined in base 402 guides the nitrogen cooling gas toward cover plate 432 disposed on the top surface of the base. Holes 432N formed in cover plate 432 guide the nitrogen cooling gas into the internal volume of the ammonia radical generator 400 defined by the inner surface of inner cylinder 428. In one embodiment, the holes 432N are formed at an angle selected to guide the stream of nitrogen cooling gas toward the central portion of the UV lamp 424. The stream of nitrogen cooling gas absorbs heat from the UV lamp 424 as the stream flows by the UV lamp, as indicated by the arrows in FIG. 13. After flowing past the UV lamp 424, the heated nitrogen cooling gas enters a plenum defined by the inner surface of sloped region 404b of top cover 404. In one embodiment, the inner surface of sloped region 404b of top cover 404 defines a plenum having a generally dome-shaped configuration. The heated nitrogen cooling gas exits the plenum via the tube 406. In one embodiment, the flow of nitrogen ($N_2$) into and out of the ammonia radical generator 400 is selected to maintain a substantially uniform temperature of the UV lamp 424.

Figure 14:
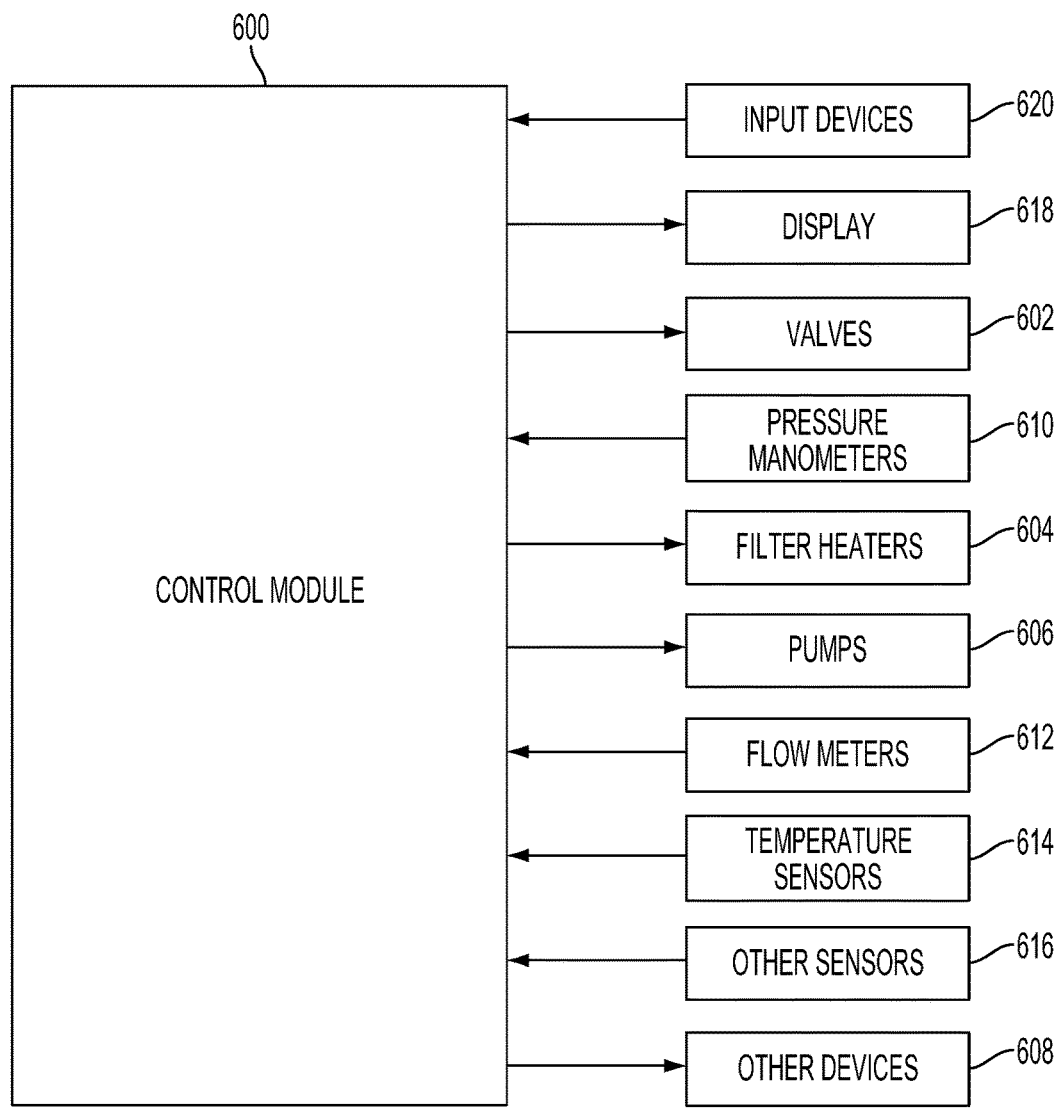
FIG. 14 is a block diagram that shows a control module for controlling a substrate processing system.

FIG. 14 is a block diagram that shows a control module 600 for controlling the systems described above. In one embodiment, the controller 114 of FIG. 1 may include some of the example components. For instance, the control module 600 may include a processor, memory and one or more interfaces. The control module 600 may be employed to control devices in the system based in part on sensed values. For example only, the control module 600 may control one or more of valves 602, filter heaters 604, pumps 606, and other devices 608 based on the sensed values and other control parameters. The control module 600 receives the sensed values from, for example only, pressure manometers 610, flow meters 612, temperature sensors 614, and/or other sensors 616. The control module 600 may also be employed to control process conditions during precursor delivery and deposition of the film. The control module 600 will typically include one or more memory devices and one or more processors.

The control module 600 may control activities of the precursor delivery system and deposition apparatus. The control module 600 executes computer programs including sets of instructions for controlling process timing, delivery system temperature, pressure differentials across the filters, valve positions, mixture of gases, chamber pressure, chamber temperature, wafer temperature, RF power levels, wafer chuck or pedestal position, and other parameters of a particular process. The control module 600 may also monitor the pressure differential and automatically switch vapor precursor delivery from one or more paths to one or more other paths. Other computer programs stored on memory devices associated with the control module 600 may be employed in some embodiments.

Typically there will be a user interface associated with the control module 600. The user interface may include a display 618 (e.g., a display screen and/or graphical software displays of the apparatus and/or process conditions), and user input devices 620 such as pointing devices, keyboards, touch screens, microphones, etc.

Computer programs for controlling delivery of precursor, deposition and other processes in a process sequence can be written in any conventional computer readable programming language: for example, assembly language, C, C++, or others. Compiled object code or script is executed by the processor to perform the tasks identified in the program.

The control module parameters relate to process conditions such as, for example, filter pressure differentials, process gas composition and flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. A heater control program may include code for controlling the current to heating units for heating components in the precursor delivery system, the substrate and/or other portions of the system. Alternatively, the heater control program may control delivery of a heat transfer gas such as helium to the wafer chuck.

Examples of sensors that may be monitored during deposition include, but are not limited to, mass flow control modules, pressure sensors such as the pressure manometers 610, and thermocouples located in delivery system, the pedestal or chuck (e.g., the temperature sensors 614). Appropriately programmed feedback and control algorithms may be used with data from these sensors to maintain desired process conditions. The foregoing describes implementation of embodiments of the invention in a single or multi-chamber semiconductor processing tool.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling operation thereof before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable end-point measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g., a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus, as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

Accordingly, the disclosure of the example embodiments is intended to be illustrative, but not limiting, of the scope of the disclosures, which are set forth in the following claims and their equivalents. Although example embodiments of the disclosures have been described in some detail for purposes of clarity of understanding, it will be apparent that certain changes and modifications can be practiced within the scope of the following claims. In the following claims, elements and/or steps do not imply any particular order of operation, unless explicitly stated in the claims or implicitly required by the disclosure.

What is claimed is:

1. An apparatus, comprising:
   a base having a first inlet and a second inlet;
   an inner cylinder disposed on the base, the inner cylinder being comprised of a first quartz material, and an inner surface of the inner cylinder defining an internal volume;
   an outer cylinder disposed on the base, the outer cylinder being comprised of a second quartz material, the outer cylinder being concentric with the inner cylinder, and an outer surface of the inner cylinder and an inner surface of the outer cylinder defining a chamber space;
   an ultraviolet (UV) lamp disposed within the internal volume; and
   a top cover positioned over the inner cylinder and the outer cylinder and in a sealing relationship with each of the inner cylinder and the outer cylinder, the top cover having a first passageway in flow communication with the chamber space, and the top cover having a second passageway in flow communication with the internal volume, wherein the first passageway is not in flow communication with the second passageway, and
   wherein the first inlet of the base is in flow communication with the chamber space and the second inlet of the base is in flow communication with the internal volume.

2. The apparatus of claim 1, wherein the first quartz material of which the inner cylinder is comprised has at least 90% transmissivity to UV-C energy having a wavelength in the range from 200 nanometers to 220 nanometers.

3. The apparatus of claim 1, wherein the second quartz material of which the outer cylinder is comprised reflects UV-C energy having a wavelength in the range from 200 nanometers to 220 nanometers.

4. The apparatus of claim 1, wherein the top cover has an annular channel formed therein and top ends of each of the inner cylinder and the outer cylinder are located within the annular channel, a first sealing member is provided around the inner surface of the top end of the inner cylinder, and a second sealing member is provided around an outer surface of the top end of the outer cylinder.

5. The apparatus of claim 4, wherein the first passageway is a hole that extends from the annular channel to a top section of the top cover.

6. The apparatus of claim 1, wherein the second passageway includes a plenum and a tube, the plenum being defined by an inner surface of the top cover, and the tube being in flow communication with the plenum and extending from a side of the top cover.

7. The apparatus of claim 1, further comprising:
   an outer enclosure that surrounds the outer cylinder, one end of the outer enclosure being located within a groove formed in the base and another end of the outer enclosure being located within a groove formed in the top cover.

8. An apparatus, comprising:
   a base having a first inlet and a second inlet, the base having an outer annular channel and an inner annular channel formed therein, the outer annular channel being in flow communication with the first inlet and the inner annular channel being in flow communication with the second inlet;
   a plurality of supports, each of the supports having an upper end and a lower end, the lower end of each of the supports being disposed in the base;
   an inner cylinder comprised of a first quartz material, a lower end of the inner cylinder being located within the outer annular channel, and an inner surface of the inner cylinder defining an internal volume;
   an outer cylinder comprised of a second quartz material, the outer cylinder being concentric with the inner cylinder, a lower end of the outer cylinder being located within the outer annular channel, and an outer surface of the inner cylinder and an inner surface of the outer cylinder defining a chamber space;
   a first sealing member provided around the inner surface of the lower end of the inner cylinder;
   a second sealing member provided around an outer surface of the lower end of the outer cylinder;
   an ultraviolet (UV) lamp disposed within the internal volume;
   a top cover mounted on the plurality of supports so that the upper ends of the plurality of supports are disposed in the top cover, the top cover having an annular channel formed therein and upper ends of each of the inner cylinder and the outer cylinder are located within the annular channel, the top cover having a sloped side portion and a top portion, an inner surface of the top cover defining a plenum that is in flow communication with the internal volume, the sloped side portion having a tube extending therefrom, the tube being in flow communication with the plenum, the sloped side portion having a plurality of holes formed therein, each of the holes extending from the annular channel to the top portion;
   a third sealing member provided around the inner surface of the upper end of the inner cylinder; and
   a fourth sealing member provided around an outer surface of the upper end of the outer cylinder,
   wherein a first passageway is defined from the first inlet to the top section of the top cover through the base, the chamber space, the annular channel formed in the top cover, and the plurality of holes formed in the side portion of the top cover, and a second passageway is defined from the second inlet to the tube extending from the side portion of the top cover through the base, the internal volume, and the plenum, and
   wherein the first passageway is not in flow communication with the second passageway.

9. The apparatus of claim 8, wherein the first quartz material of which the inner cylinder is comprised has at least 90% transmissivity to UV-C energy having a wavelength in the range from 200 nanometers to 220 nanometers.

10. The apparatus of claim 8, wherein the second quartz material of which the outer cylinder is comprised reflects UV-C energy having a wavelength in the range from 200 nanometers to 220 nanometers.

11. The apparatus of claim 8, further comprising:
an outer enclosure that surrounds the outer cylinder, one end of the outer enclosure being located within a groove formed in the base and another end of the outer enclosure being located within a groove formed in the top cover.

12. The apparatus of claim 8, wherein one or more of the first, second, third, and fourth sealing members is an O-ring.

13. The apparatus of claim 8, further comprising:
a cooling tube disposed in the base.

14. The apparatus of claim 8, further comprising:
a cover plate disposed on a top surface of the base, the cover plate having a plurality of holes therein, the holes being in flow communication with the inner annular channel formed in the base and the internal volume.

15. The apparatus of claim 14, wherein one or more of the plurality of holes is aligned with a central portion of the UV lamp.

16. A system, comprising:
a process chamber;
an ammonia radical generator coupled to the process chamber in flow communication, the ammonia radical generator including
a base having a first inlet and a second inlet,
an inner cylinder disposed on the base, the inner cylinder being comprised of a first quartz material, and an inner surface of the inner cylinder defining an internal volume,
an outer cylinder disposed on the base, the outer cylinder being comprised of a second quartz material, the outer cylinder being concentric with the inner cylinder, and an outer surface of the inner cylinder and an inner surface of the outer cylinder defining a chamber space,
an ultraviolet (UV) lamp disposed within the internal volume, and
a top cover positioned over the inner cylinder and the outer cylinder and in a sealing relationship with each of the inner cylinder and the outer cylinder, the top cover having a first passageway in flow communication with the chamber space, and the top cover having a second passageway in flow communication with the internal volume, wherein the first passageway is not in flow communication with the second passageway,
a source of ammonia gas coupled to the first inlet in flow communication, the first inlet being in flow communication with the chamber space through the base; and
a source of cooling gas coupled to the second inlet in flow communication, the second inlet being in flow communication with the internal volume through the base.

17. The system of claim 16, wherein the first quartz material of which the inner cylinder is comprised has at least 90% transmissivity to UV-C energy having a wavelength in the range from 200 nanometers to 220 nanometers, and the second quartz material of which the outer cylinder is comprised reflects UV-C energy having a wavelength in the range from 200 nanometers to 220 nanometers.

18. The system of claim 16, wherein the ammonia radical generator further includes an outer enclosure that surrounds the outer cylinder, one end of the outer enclosure being located within a groove formed in the base and another end of the outer enclosure being located within a groove formed in the top cover.

19. The system of claim 16, wherein the top cover has an annular channel formed therein and top ends of each of the inner cylinder and the outer cylinder are located within the annular channel, a first sealing member is provided around the inner surface of the top end of the inner cylinder, and a second sealing member is provided around an outer surface of the top end of the outer cylinder.

20. The system of claim 16, wherein the second passageway includes a plenum and a tube, the plenum being defined by an inner surface of the top cover, and the tube being in flow communication with the plenum and extending from a side of the top cover.

* * * * *